(12) United States Patent
Weimer et al.

(10) Patent No.: US 6,177,127 B1
(45) Date of Patent: *Jan. 23, 2001

(54) METHOD OF MONITORING EMISSIVITY (75) Inventors: Ronald A. Weimer, Boise, ID (US); Avishai Kepten, Beit H'Cerem (IL); Michael Sendler, Boise, ID (US)

(73) Assignee: Micron Technology, Inc., Boise, ID (US)

( * ) Notice: Under 35 U.S.C. 154(b), the term of this patent shall be extended for 0 days.

This patent is subject to a terminal disclaimer.

(21) Appl. No.: 09/191,236

(22) Filed: Nov. 13, 1998

Related U.S. Application Data (63) Continuation-in-part of application No. 08/922,958, filed on Sep. 3, 1997, now Pat. No. 5,962,065, which is a continuation of application No. 08/572,968, filed on Dec. 15, 1995, now Pat. No. 5,688,550.

(51) Int. Cl.$^7$ .................................................. C23C 16/46
(52) U.S. Cl. ........................ 427/8; 427/248.1; 427/397.7; 438/7; 438/16; 438/381; 438/398; 438/964; 148/DIG. 1; 148/DIG. 3; 148/DIG. 122
(58) Field of Search ..................... 427/8, 248.1, 397.7; 438/7, 16, 381, 398, 964; 148/DIG. 1, DIG. 3, DIG. 122

(56) References Cited

U.S. PATENT DOCUMENTS

| | | | |
|---|---|---|---|
| 4,155,779 | 5/1979 | Auston et al. | 148/1.5 |
| 4,332,833 | 6/1982 | Aspnes et al. | 427/8 |
| 5,073,698 | * 12/1991 | Stultz . | |
| 5,312,771 | * 5/1994 | Yonehara . | |
| 5,372,836 | 12/1994 | Imahashi et al. | 427/8 |
| 5,962,065 | * 10/1999 | Weimer et al. . | |

* cited by examiner

*Primary Examiner*—Timothy Meeks
(74) *Attorney, Agent, or Firm*—Workman, Nyddeger & Seeley

(57) ABSTRACT

A method for reliably forming polysilicon of a desired surface roughness includes providing a layer of doped or undoped amorphous silicon on a substrate and heating said substrate while monitoring the emission of said substrate and comparing the monitored emission with an expected emission attributable to the heating regime employed. An increase in the monitored emission not attributable to the heating regime signals a transition of the layer of amorphous silicon to rough polysilicon. A decrease in the monitored emission not attributable to the heating regime signals a transition to smooth polysilicon. The increases and decreases in the monitored emission can be used to end the heating regime at the time at which the desired surface roughness of polysilicon is formed, or merely to passively monitor the process. The power supplied to heat the substrate to a desired temperature can also be monitored, in that a drop in required power is indicative of the formation of polysilicon. By selecting the degree of crystallinity of the layer of doped or undoped amorphous silicon on a substrate, the grain size of the resulting HSG polysilicon can be controlled.

29 Claims, 8 Drawing Sheets

METHOD OF MONITORING EMISSIVITY

1. RELATED APPLICATIONS

The present application is a continuation-in-part of U.S. patent application Ser. No. 08/922,958, filed on Sep. 3, 1997, now U.S. Pat. No. 5,962,065, which is a continuation of U.S. patent application Ser. No. 08/572,968, filed on Dec. 15, 1995, now U.S. Pat. No. 5,688,550.

BACKGROUND OF THE INVENTION

2. The Field of the Invention

The present invention relates to the manufacture of semiconductor devices. More particularly, the present invention is directed to a method of forming polysilicon having a crystal structure with a desired surface roughness useful in the manufacture of semiconductor memory devices.

3. The Relevant Technology

Polysilicon is used in a variety of ways in the design and fabrication of integrated circuits. Polysilicon is used in forming gates, contacts, capacitors, and many other circuit structures.

The capacitance of polysilicon is influenced significantly by its structure. The surface roughness of polysilicon must be consistently controlled to achieve desired capacitance. Capacitance of capacitors constructed with polysilicon generally increases with surface roughness because of increased surface area.

Consistency in achieving desired polysilicon surface roughness in the production fabrication environment has proved somewhat difficult.

SUMMARY OF THE INVENTION

In accordance with the method of the present invention, polysilicon of a desired surface roughness is reliably and repeatable formed by providing a layer of doped or undoped amorphous silicon on a substrate and heating the substrate while monitoring the emission of the substrate relative to an expected emission attributable to the heating regime employed.

In conversion of a layer of amorphous silicon to polysilicon, the layer of amorphous silicon is heated in a chamber while the electromagnetic emission therefrom is monitored with a pyrometer. A signature change in the emission rate indicates formation of polysilicon. The silicon layer is heated using a heating element and control system to maintain a constant silicon layer temperature. The power delivered to the heating element automatically adjusts such that the constant temperature is maintained.

An increase in the monitored emission not attributable to the heating regime signals the transition from amorphous silicon to rough polysilicon. A decrease of the monitored emission that is not attributable to the heating regime signals a transition to smooth polysilicon. The increase and decrease in the monitored emission can be used to end the heating regime at the time at which the desired surface roughness of polysilicon is formed, or merely to passively monitor the process. The in situ monitoring of the present invention provides the advantages of greater control, reliability, and repeatability in forming polysilicon having a desired surface roughness and electrical and other characteristics related thereto.

The power delivered to the heating elements drops upon formation of polysilicon, which may be explained by an increase in the absorption of the silicon during its conversion from an amorphous to a crystalline form. As such, the formation of polysilicon can be detected by monitoring emission rates as well as by monitoring the power delivered to the heating elements.

It is preferred to deposit silicon with a selected degree of crystallinity in order to better control the grain size of the resulting HSG polysilicon. If the silicon being deposited is completely amorphous silicon, grains of silicon that are larger than what may be desirable tend to form.

In certain applications, it is preferable to practice the invention with a silicon/germanium alloy instead of using pure silicon. A Si/Ge alloy is preferred for use in a capacitor storage node that is adjacent to a capacitor dielectric plate having a relatively high dielectric constant. The silicon/germanium alloy is highly conductive, reduces leakage through the dielectric plate, and would be particularly useful in DRAM cells in which leakage control is critical.

These and other features of the present invention will become more fully apparent from the following description and appended claims, or may be learned by the practice of the invention as set forth hereinafter.

BRIEF DESCRIPTION OF THE DRAWINGS

In order that the manner in which the above-recited and other advantages of the invention are obtained may be more fully explained, a more particular description of the invention briefly described above will be rendered by reference to specific embodiments thereof which are illustrated in the appended drawings. Understanding that these drawings depict only typical embodiments of the invention and are not therefore to be considered to be limiting of its scope, the invention will be described and explained with additional specificity and detail through the use of the accompanying drawings in which.

DETAILED DESCRIPTION OF THE PREFERRED EMBODIMENTS

The present invention provides an improved method for forming polysilicon having a particular desired crystal structure and surface roughness. The present invention is particularly useful in reliably producing hemispherical grain (HSG) polysilicon for improved capacitance.

According to a preferred embodiment of the method of the present invention, an amorphous silicon layer is provided on a substrate. The amorphous silicon layer may be doped or undoped, and implanted if desired. The amorphous silicon layer may be produced by any suitable means including CVD using a Halide precursor such as $Si_2H_6$, and PVD. The substrate is then heated to a preselected temperature and seeded for a length of time, then heated to and maintained at a second temperature of at least 100° C., where the second temperature is preferably within the range of about 500 to 1000 ° C. The emission of the substrate with the amorphous silicon layer thereon is measured at a wavelength somewhere within the range of about $10^{-2}$ to 100 µm, and is preferably within the range of about 1 to 10 µm. The second temperature may optionally be the same as the seeding temperature.

The means employed to heat the amorphous silicon can be any conventional means including rapid thermal anneal (RTA) devices and conventional devices for providing deposition environments, such as CVD, PECVD, and PCVD reactors and the like. The amorphous silicon may be heated in a vacuum or at ambient pressure. Typically known means other than seeding may also be used to induce crystal formation. Whatever heating means is employed, the temperature is preferably controlled by a temperature control means independent of any temperature feedback from the substrate or amorphous silicon layer itself, although feedback temperature control may optionally be used, as described hereinafter.

While the amorphous silicon layer is maintained at the second temperature, the emission of the amorphous silicon layer is monitored by suitable means, such as a single color pyrometer. As the amorphous silicon transforms to rough polysilicon (HSG) or to smooth polysilicon, the curve traced over time by the monitored emission undergoes specific changes. These changes allow the detection of the transition from amorphous silicon to rough polysilicon or from amorphous silicon to smooth polysilicon. This detection capability may be used merely to monitor a process for forming polysilicon, or the output of the emission measuring device may be coupled directly into a controller for closed loop feedback control of the surface roughness formation process. With feedback control, inherent process variability can be minimized or avoided by stopping the process and cooling the polysilicon at the moment a desired surface roughness is reached.

Figure 1:
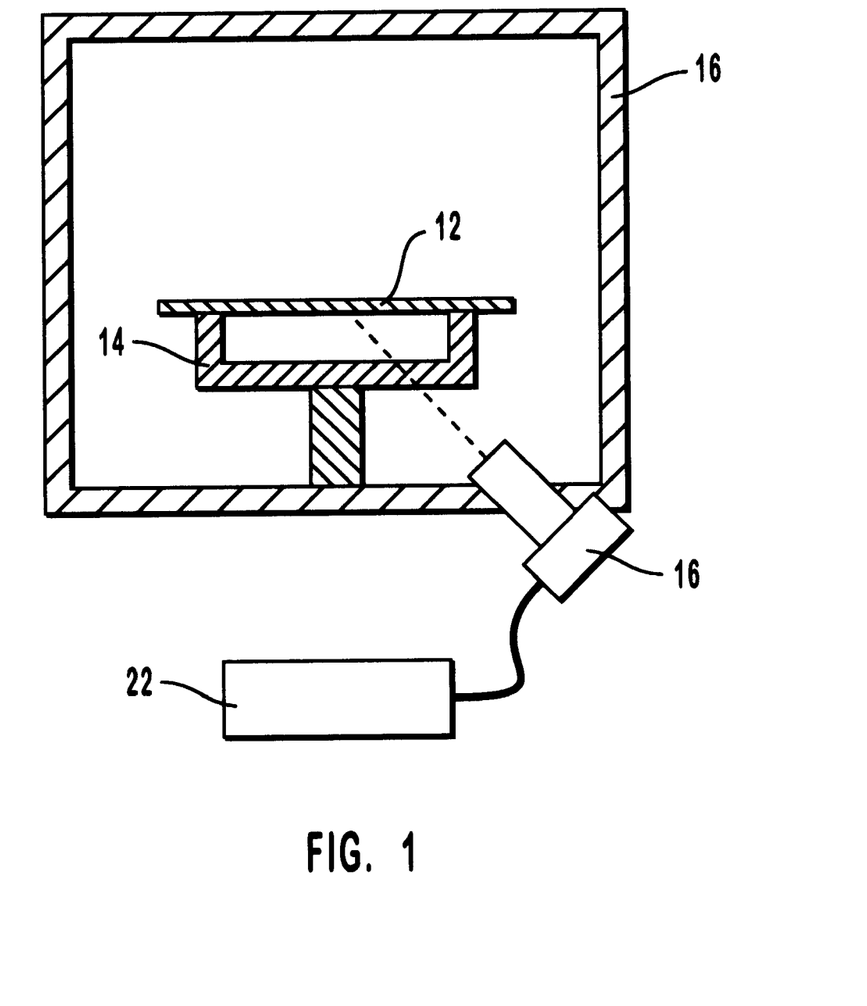
FIG. 1 is a schematic representation of some materials and equipment useful in the method of the present invention.

FIG. 1 shows some equipment and materials useful in the method of the present invention. A substrate 12 in the form of a silicon wafer has had a layer of amorphous silicon deposited on both the front and back sides thereof. Substrate 12 and the amorphous silicon layer are heated by suitable means, and crystal formation is induced by suitable means. An emission detector 16 in the form of a single color pyrometer is placed so as to detect emissions from the back side of substrate 12. Front side emission detection may also be used. Emission detector 16 may be coupled to a controller 22 for closed loop feedback process control.

Figure 2:
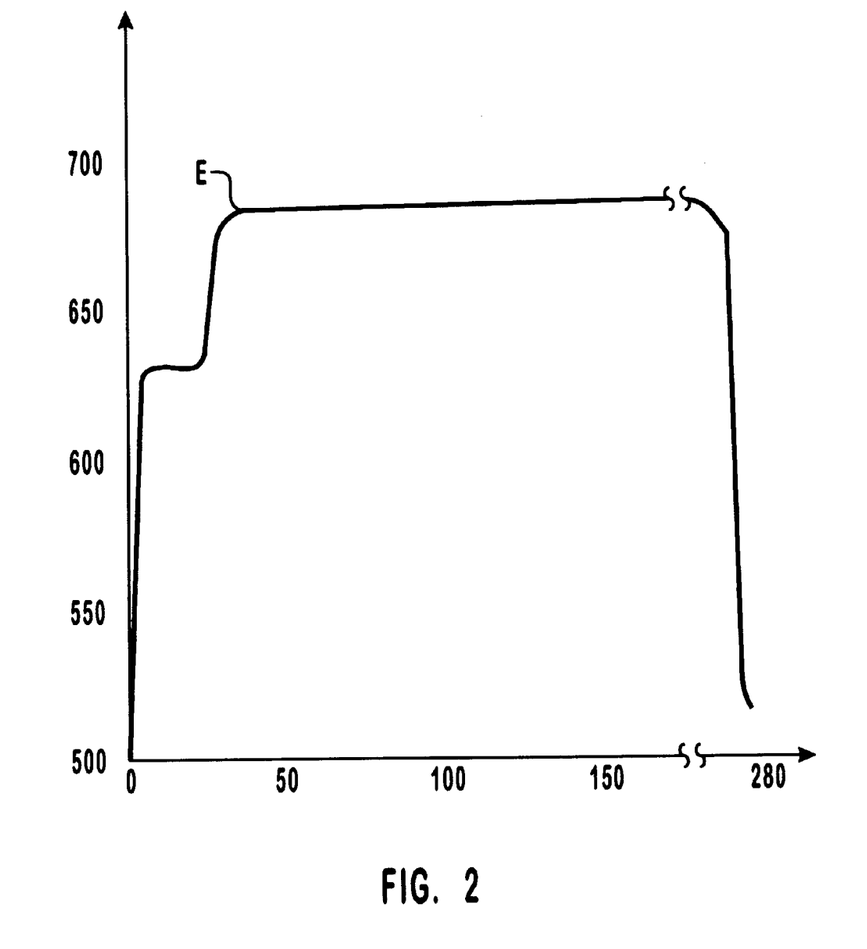
FIG. 2 is a graph of an emission of seeded amorphous silicon measured by a single color pyrometer over time.

FIG. 2 shows a measured emission curve E measured by a single color pyrometer arranged as illustrated in FIG. 1. The substrate with a layer of amorphous silicon thereon was first seeded for 20 seconds at a first temperature of 630° C., then annealed for 4 minutes at a second temperature of 685° C. Measured emission curve E is shown on a y-axis scale of degrees Celsius according to the calibration of the single color pyrometer, with the x-axis representing seconds.

Measured emission curve E of FIG. 2 is flat or nearly flat during the time the substrate is held at the second temperature. Measured emission curve F of FIG. 2 is thus characteristic of the heating regime employed. No changes appear in measured emission curve E which are not accounted for by the heating regime.

Figure 3:
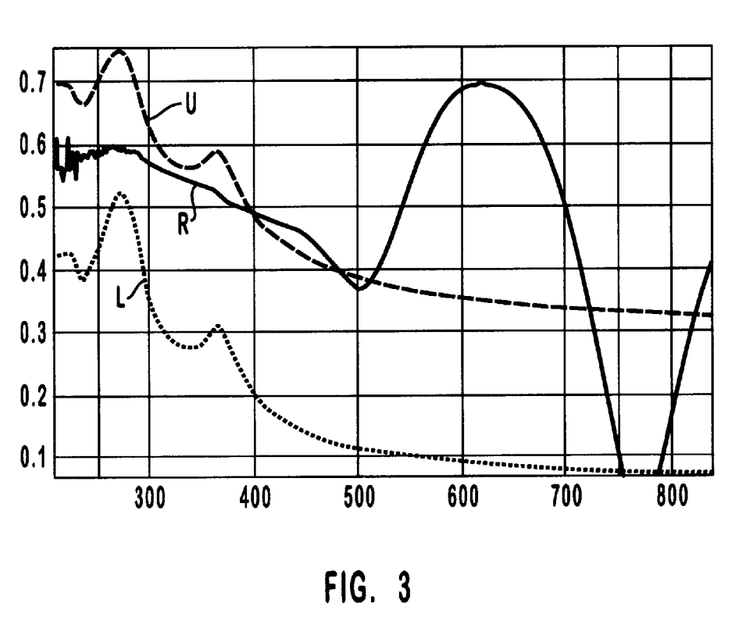
FIG. 3 is a graph of a reflectivity curve of the amorphous silicon resulting after the processing represented in FIG. 2.

FIG. 3 shows a measured percent reflectance curve R, as a function of wave length, of an amorphous silicon layer after processing according to the heating regime represented in FIG. 2. An upper characteristic curve U and a lower characteristic curve L for the reflectance of smooth polysilicon are also displayed. The x-axis is scaled in nanometers (nm). Reflectance curve R between 200 and 400 nm shows the characteristics of amorphous silicon, demonstrating that the processing according to the heating regime of FIG. 2 did not convert amorphous silicon into rough or smooth polysilicon.

Figure 4:
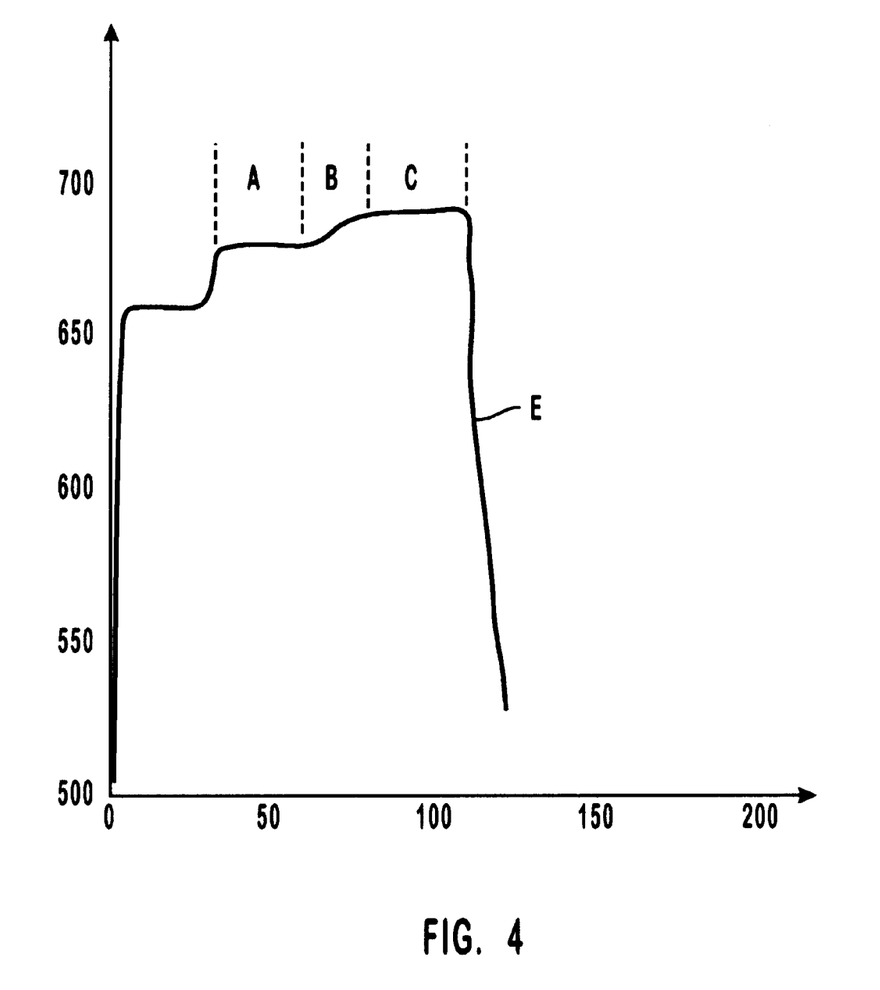
FIG. 4 is a graph of a measured emission of seeded amorphous silicon over time, beginning with amorphous silicon and converting to rough polysilicon.

FIG. 4 is another graph of a measured emission curve E measured by a single color pyrometer arranged as in FIG. 1. A substrate having an amorphous silicon layer thereon was seeded for 30 seconds at a first temperature of 660° C. and then annealed for 80 seconds at a second temperature of 685° C. At the beginning of the anneal at the second temperature, measured emission curve E, in region A thereof, is the same as the characteristic curve expected due to the temperature regime alone. But in region B of measured emission curve E, the measured emission increases. In region C, the measured emission remains at the higher level reached in region B. The increase in the measured emission at region B has no corresponding increase in the characteristic emission curve, which is the emission expected from the heating regime employed. The emission change measured in region B is related to the formation of rough polysilicon, as shown below.

Figure 5:
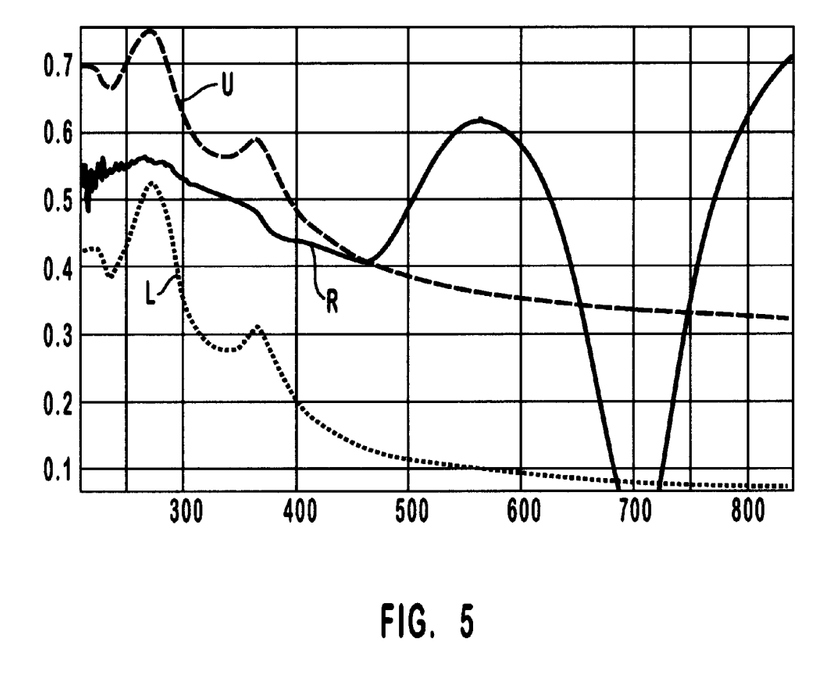
FIG. 5 is a graph of a reflectivity curve of the amorphous silicon resulting after the processing represented in FIG. 4, with processing terminating in a region A.

FIG. 5 is a graph of the measured reflectance of an amorphous polysilicon film processed according to the heating regime illustrated in FIG. 4, but with the processing not completed as shown in FIG. 4, but terminated instead in region A of measured emission curve E. Reflectance curve R of FIG. 5 is characteristic of amorphous silicon, showing that the amorphous silicon layer remains amorphous during region A of FIG. 4.

Figure 6:
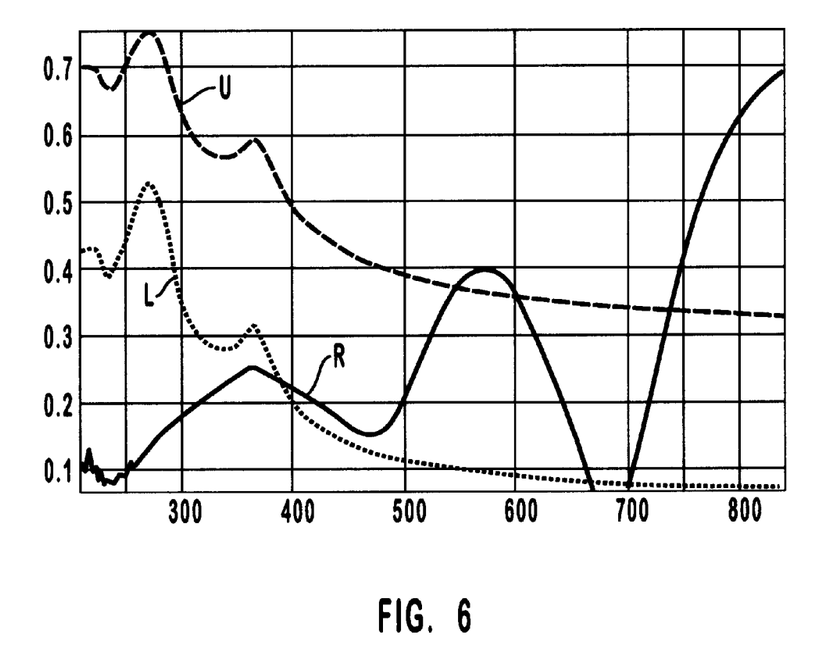
FIG. 6 is a graph of a reflectivity curve of the rough polysilicon resulting after the processing represented in FIG. 4, with processing terminating in a region C.

FIG. 6 is a graph of the measured reflectance of an amorphous silicon film processed according to the heating regime illustrated in FIG. 4, with the processing terminated in region C of FIG. 4. The extremely low reflectance exhibited between 200 and 400 nm is characteristic of rough polysilicon or HSG, showing that by the time of region C of the measured emission curve of FIG. 4, the amorphous silicon layer has been converted into rough polysilicon.

Figure 7:
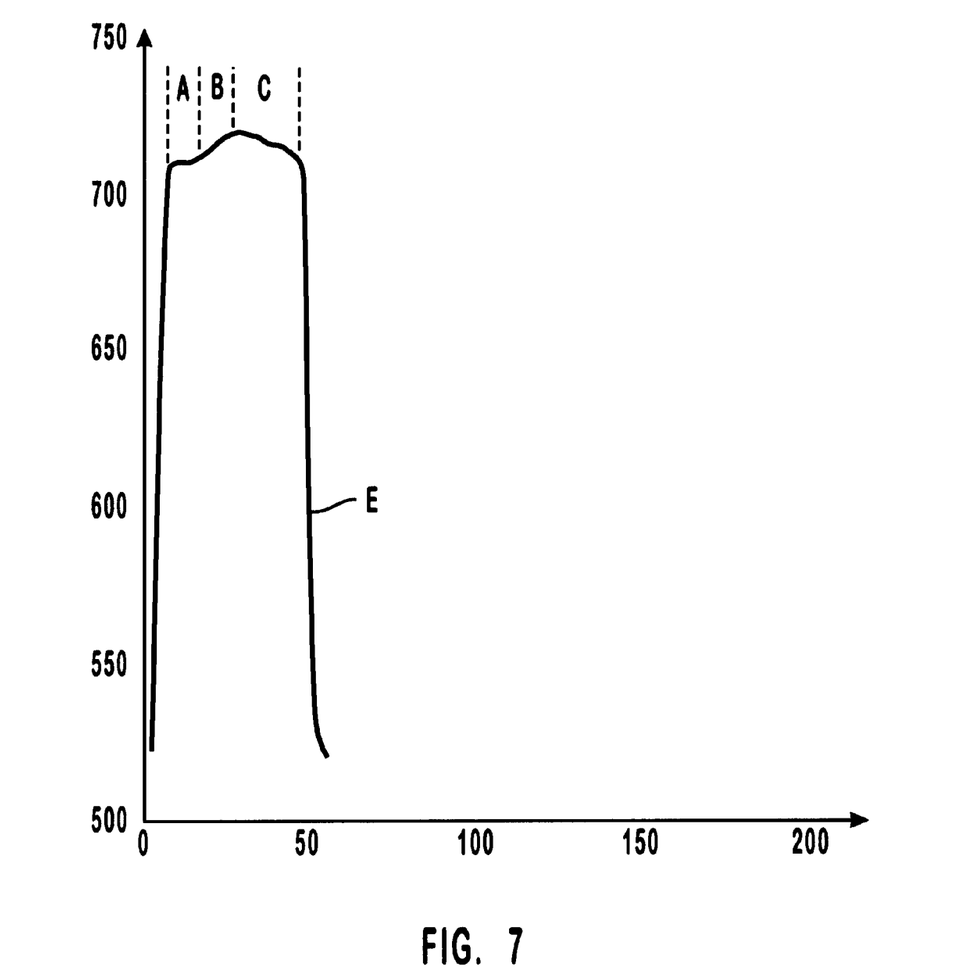
FIG. 7 is a graph of a measured emission of amorphous silicon over time, beginning with amorphous silicon and converting to smooth polysilicon.

FIG. 7 is yet another graph of a measured emission curve E measured by a single color pyrometer arranged as in FIG. 1. A substrate having an amorphous silicon layer thereon was seeded for 5 seconds at a first temperature of 710° C. and then annealed for 45 seconds at a second temperature identical to the first, 710° C. At the beginning of the anneal, measured emission curve S, in region A thereof, is the same as the characteristic curve expected due to the temperature regime alone. But in region B of measured emission curve E, the measured emission increases. In region C, the measured emission decreases.

The increase in the measured emission at region B has no corresponding increase in the characteristic emission, which is the emission expected from the heating regime employed. Likewise, the decrease in region C has no corresponding decrease in the characteristic emission expected from the heating regime employed. The emission change measured in region B is related to the formation of large grained polysilicon, as noted above, while the emission changes measured in region C are related to the formation of small grained or smooth polysilicon, as shown below. A decrease such as that in region C may also be observed without any prior increase.

Figure 8:
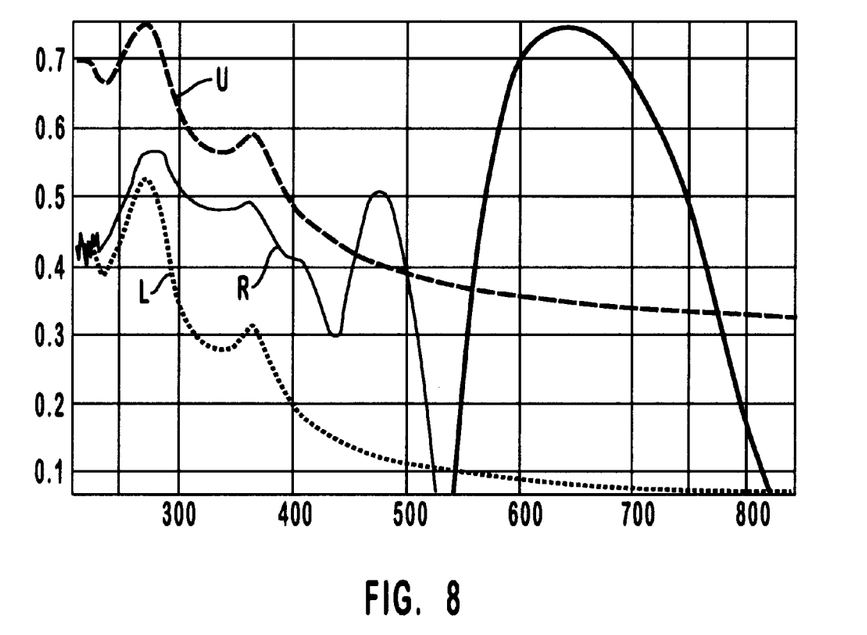
FIG. 8 is a graph of a reflectivity curve of the silicon produced after the processing represented in FIG. 7, with processing terminating after the end of a region C.

FIG. 8 is a graph of the measured reflectance of an amorphous silicon film processed according to the heating regime illustrated in FIG. 7, with the processing completed as shown in FIG. 7. Reflectance curve R of FIG. 8 is characteristic of smooth polysilicon, demonstrating that the amorphous silicon layer undergoes a transition during region C of FIG. 7 from the rough polysilicon formed in region B to smooth polysilicon.

The increases and decreases in the measured emission illustrated above may be used to detect the formation of the desired smoothness or roughness of polysilicon, upon which the heating of the substrate and polysilicon layer may be terminated. Alternatively, the measured emission may be monitored only as a control to evaluate the process, without direct feedback. Other heating regimes than those above may be employed.

The exact mechanisms for causing the characteristic increase in emission during the transition to rough polysilicon illustrated above have not been determined. The increase in emission seen in region B may be due mostly to an increase in emissivity, or to increased emissivity and an actual increase in temperature. Both the emissivity and the absorption characteristics of a material can change with changes in the surface thereof. It is thus possible that an increase in both temperature, due to increased absorption, and an increase in emissivity may occur. While a single color pyrometer is currently preferred for monitoring the emission changes, other instruments, including dual or multi-color pyrometers may be employed.

While a heating mechanism employing environmental temperature control is presently preferred, rather than one employing feedback temperature control using feed back from the substrate, a feedback temperature control system may nonetheless be employed in the present invention. It is preferred that the feedback temperature control be sensitive to actual temperature only, and not to emissivity changes, while the emission detector employed is sensitive to all emission changes. Even with a constant temperature maintained at the substrate by a feedback controller, the emissivity changes would then be detected by the emission detector as an increase in emission from the substrate, signalling the formation of rough polysilicon.

It has been found that depositing amorphous silicon with certain degrees of crystallinity provides better control over the grain size of the resulting HSG polysilicon than depositing silicon that is completely amorphous. Grains that are larger than what may be desirable tend to form when completely amorphous silicon is used. In this process, silicon that is not completely amorphous, but rather has a selected degree of crystallinity, is formed upon a substrate. The silicon is heated while the emissions from the substrate are monitored. The heating is terminated after a time that is determined in response to the emissions from the substrate. By this process, the resulting polysilicon will have a desired grain size.

The inventive method can be used to form a capacitor storage node. Preferably, the capacitor storage node will be adjacent to a capacitor dielectric plate having a relatively high dielectric constant. In this case, the capacitor storage node will preferably be formed from a silicon/germanium alloy instead of using pure silicon. The silicon/germanium alloy is highly conductive and reduces leakage through the capacitor dielectric plate. The alloy would be particularly useful in DRAM cells in which leakage control is critical. In this case, the inventive method would include forming an amorphous silicon/germanium alloy having a selected degree of crystallinity upon a substrate. The amorphous silicon/germanium alloy is monitored for emissions while it is heated, and the heating is terminated after a time determined in response to the monitored emissions.

In a preferred embodiment of the inventive method, a layer of amorphous silicon is heated using a heating element and control system to maintain a constant temperature in a chamber while the electromagnetic emission of the silicon is monitored with a pyrometer. The power delivered to the heating element automatically adjusts such that the constant temperature is maintained. A signature change in the emission rate indicates formation of polysilicon. During conversion of the amorphous silicon to polysilicon, the power delivered to the heating elements drops. A possible explanation for this decrease in power being supplied to the heating elements is the absorption of the silicon as it converts from an amorphous form to a crystalline form. By monitoring power to the heating elements, the formation of polysilicon can be detected. In this case, the inventive method would include forming amorphous silicon upon a substrate and then delivering power from a variable supply of power to a heating element to heat the amorphous silicon to a desired temperature. The heating elements are montored and the delivery of power from the variable supply of power to the heating elements is terminated in response to a change in the power that is delivered from the variable supply of power. Particularly, the change that initiates the termination of the power is a reduction in the power delivered by the variable supply of power to the heating element.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed and desired to be secured by United States Letters Patent is:

1. A method for forming polysilicon having a desired surface roughness, said method comprising:

forming silicon having a selected degree of crystallinity upon a substrate, wherein said selected degree of crystallinity is less than complete crystallinity;

heating said silicon upon said substrate;

monitoring an emission of said substrate while heating said substrate; and terminating said heating in response to said emission, wherein said emission is indicative of the formation of polysilicon having said desired surface roughness.

2. The method as defined in claim 1, wherein monitoring the emission of said substrate comprises using a single-color pyrometer to monitor the emission of said substrate within a wavelength range of about $10^{-2}$ to 100 $\mu$m.

3. The method as defined in claim 2, wherein monitoring the emission of said substrate comprises using a single-color pyrometer to monitor the emission of said substrate within a wavelength range of about 1 to 10 $\mu$m.

4. The method as defined in claim 2 wherein said substrate is a silicon wafer having a backside and said single-color pyrometer monitors said emission of said wafer from said backside of said wafer.

5. The method as defined in claim 1 wherein heating said silicon upon said substrate comprises an RTA.

6. The method as defined in claim 1 wherein terminating said heating in response to said emission comprises detecting a first level of said emission representative of conversion of at least a portion of said silicon to rough polysilicon.

7. The method as defined in claim 6, further comprising, after detecting said first level of said emission, detecting a second level of said emission representative of conversion of substantially all of said silicon to rough polysilicon.

8. The method as defined in claim 7, further comprising, after detecting said second level of said emission, detecting a progressive decrease of said second level of said emission representative of conversion of at least a portion of said silicon to smooth polysilicon.

9. The method as defined in claim 8, further comprising detecting an end of said progressive decrease of said second level of said emission representative of conversion of substantially all of said silicon to smooth polysilicon.

10. The method as defined in claim 1, wherein said heating is terminated after said monitored emission has a first increase therein that is not attributable to said heating, thereby resulting in the formation of rough polysilicon from the silicon.

11. The method as defined in claim 1, wherein said heating is terminated after said monitored emission has a decrease therein that is not attributable to said heating, thereby resulting in the formation of at least some smooth polysilicon.

12. The method as defined in claim 1, wherein said heating is terminated after said monitored emission has a decrease therein that is not attributable to said heating, thereby resulting in the conversion of substantially all of said silicon to smooth polysilicon.

13. The method as defined in claim 1, wherein said emission that is indicative of the formation of polysilicon having said desired surface roughness is also representative of a predetermined grain size of said silicon upon said substrate.

14. A method for forming a crystalline alloy of silicon/germanium having a desired surface roughness, said method comprising:

forming a silicon/germanium alloy having a selected degree of crystallinity upon a substrate, wherein said selected degree of crystallinity is less than complete crystallinity;

heating said silicon/germanium alloy upon said substrate;

monitoring an emission of said substrate while heating said silicon/germanium alloy upon said substrate; and terminating said heating in response to said emission, wherein said emission is indicative of the formation of said crystalline alloy of silicon/germanium having said desired surface roughness.

15. The method as defined in claim 14, wherein monitoring the emission of said substrate comprises using a single-color pyrometer to monitor an emission of said substrate.

16. The method as defined in claim 14, wherein said substrate is a wafer having a backside and said single-color pyrometer monitors said emission of said wafer from said backside of said wafer.

17. The method as defined in claim 14, wherein heating said silicon upon said substrate comprises an RTA.

18. The method as defined in claim 14, wherein said heating is terminated after said monitored emission has a first increase therein that is not attributable to said heating.

19. The method as defined in claim 14, wherein said heating is terminated after said monitored emission has a decrease therein that is not attributable to said heating.

20. A method for detecting the conversion of silicon to roughened polysilicon, said method comprising:

providing a substrate;

forming a layer of silicon having a selected degree of crystallinity on said substrate, wherein said selected degree of crystallinity is less than complete crystallinity;

heating said substrate in a temperature-controlled environment having an environmental temperature;

measuring the emission of said substrate while maintaining said environmental temperature at a selected constant level sufficient to convert said layer of silicon to roughened polysilicon;

tracing a measured emission curve over time from said measured emission, said measured emission curve having a slope; and decreasing said environmental temperature from said selected constant level after said emission curve has an increase in the slope thereof.

21. The method as defined in claim 20, wherein said decreasing said environmental temperature comprises decreasing said environmental temperature from said selected constant level after said emission curve begins to have an increase in the slope thereof and reaches a plateau.

22. The method as defined in claim 21, wherein said decreasing said environmental temperature comprises decreasing said environmental temperature from said selected constant level immediately after said emission curve reaches said plateau.

23. The method as defined in claim 21, wherein said decreasing said environmental temperature comprises decreasing said environmental temperature from said selected constant level at a set time after said emission curve reaches said plateau.

24. The method as defined in claim 20, wherein said selected constant level is at least 100° C.

25. The method as defined in claim 24, wherein said selected constant level is within the range of about 500° C. to about 1000° C.

26. A method for increasing the crystallinity of a semiconductor material selected from the group consisting of silicon and silicon/germanium alloy from a first degree of crystallinity to a higher, second degree of crystallinity, said method comprising:

forming a semiconductor material having said first degree of crystallinity upon a substrate;

heating said semiconductor material upon said substrate;

monitoring an emission of said substrate while heating said substrate; and terminating said heating in response to said emission, wherein said emission is characteristic of the conversion of said semiconductor material to said second degree of crystallinity.

27. A method of forming a silicon containing material having a desired surface roughness, said method comprising:

heating a substrate having amorphous phase silicon containing material selected from the group consisting of silicon and silicon/germanium alloy thereon; and terminating said heating when a monitored emission of the substrate is characteristic of achievement of said desired surface roughness of said silicon containing material.

28. The method as defined in claim 27, wherein the monitored emission of the substrate that is characteristic of achievement of said desired surface roughness is also characteristic of the conversion of the amorphous phase silicon containing material to a crystallized form thereof.

29. The method as defined in claim 28, wherein said crystallized form of said amorphous phase silicon containing material is selected from the group consisting of polysilicon and polycrystalline germanium/silicon.

* * * * *

UNITED STATES PATENT AND TRADEMARK OFFICE
CERTIFICATE OF CORRECTION

PATENT NO. : 6,177,127 B1
DATED : January 23, 2001
INVENTOR(S) : Ronald A. Weimer, Avishai Kepten and Michael Sendler Page 1 of 1

It is certified that error appears in the above-identified patent and that said Letters Patent is hereby corrected as shown below:

<u>Column 3,</u>
Line 16, after "means" insert -- , --
Line 18, after "and" change "PCVD" to -- LPCVD --
Line 19, after "reactors" insert -- , --

<u>Column 4,</u>
Line 55, after "curve" change "S" to -- E --

<u>Column 5,</u>
Line 32, after "pyrometers" insert -- , --
Line 35, after "using" change "feed back" to -- feedback --

Signed and Sealed this

Sixteenth Day of April, 2002

Attest:

JAMES E. ROGAN
*Attesting Officer*   *Director of the United States Patent and Trademark Office*